United States Patent [19]

Froment et al.

[11] 4,412,335

[45] Oct. 25, 1983

[54] DIGITAL SIGNAL DISTRIBUTION SYSTEM

[75] Inventors: Jean-Claude Froment, Villeneuve-Loubet; Jean-Louis Marijon, Gradignan; Gerard Orengo, Antibes; Michel Verhaeghe, Le Suve, all of France

[73] Assignee: International Business Machines Corporation, Armonk, N.Y.

[21] Appl. No.: 305,564

[22] Filed: Sep. 25, 1981

[30] Foreign Application Priority Data

Nov. 28, 1980 [EP] European Pat. Off. ........ 80430027.5

[51] Int. Cl.³ .............................................. H03K 6/02
[52] U.S. Cl. ...................................... 375/3; 307/443; 330/310; 375/36
[58] Field of Search ............. 178/63 R, 63 A, 70 TS; 375/36, 3; 364/900; 330/255, 310, 119, 121; 340/286, 291; 307/443, 247 R, 291; 370/85

[56] References Cited

U.S. PATENT DOCUMENTS 3,786,276 1/1974 Rösch .................................. 307/443
3,924,240 2/1975 Given ..................................... 370/85
3,946,246 3/1976 Marley ................................ 307/443

Primary Examiner—Benedict V. Safourek
Attorney, Agent, or Firm—Robert J. Haase

[57] ABSTRACT

A digital signal distribution system for distributing digital signals to remote points of a machine. It is comprised of a distribution device arranged at each of said points. In each device, a receiver receives on its true and complementary inputs, the signal to be distributed. The drivers are connected to the receivers through a crossed connection, the true output of the receiver being connected to the complementary input of the driver, and the complementary output of the receiver being connected to the true input of the driver, so as to cancel the skew of the pulse width of the signal to be distributed. The signals on outputs of the driver circuits can be utilized locally or transmitted to another remote point.

4 Claims, 5 Drawing Figures

DIGITAL SIGNAL DISTRIBUTION SYSTEM

TECHNICAL FIELD

This invention concerns a digital signal distribution system for distributing digital signals between remote points in a machine or between a plurality of machines, with which it is possible to reduce the skew of the signal widths, to a minimum, thereby making it possible to maintain the cyclic signal ratio constant.

In the present digital data processing machines, such as, for instance, central processing units, communications controllers or telephone exchanges, etc., high frequency clock signals are necessary to synchronize the operation of the different circuits which the machine is comprised of. Consequently, the clock signals must be conveyed to several points and it is necessary that no distortion occur in the signal width, i.e., that the cyclic ratio of the clock signal be maintained constant during the distribution, in order to limit the error sources.

PRIOR ART

At present, the problems encountered to reduce the signal skew can be solved by providing adjusting circuits for adjusting the skews introduced during the signal transmission.

For instance, the article published in IBM Technical Disclosure Bulletin, Volume 21, No. 7, December 1978, pages 2998 and 2999 discloses a device adapted to compensate automatically for the signal skew in the integrated clock circuits. With this device, it is possible to adjust automatically the clock signals generated from the main oscillator when all the clock circuits are on a same chip. To this end, it requires means for generating calibration signals which, according to the chip characteristics, act, with the help of an adjusting circuit, to adjust the phase skews between the different clock signals derived from the original signal supplied by the oscillator. With such a technique, it is possible to reduce the skew between the different signals generated from the main oscillator but it is not possible to solve the problem raised when distributing these signals to remote points.

U.S. Pat. No. 3,751,591 discloses a clock signal distribution system conceived so that the reflections inside the system cause all the points therein to be at the same voltage at the same time when the system receives the signals from a driving circuit. This sets constraints as to the rise time, the impedance, etc., which limit the applications of such a system.

SUMMARY OF THE INVENTION

An object of this invention is to provide for a digital signal distribution system which does not require additional circuits to decrease the skew of the signal widths.

Another object of this invention is to provide for such a distribution system particularly suitable for the distribution of clock signals into a machine.

Another object of this invention is to provide for a signal distribution system of flexible use.

Such a system is comprised of signal distribution devices, each device including a fully differential, two-complementary input and two-complementary output receiver, which is connected to a driving circuit which is also fully differential. The devices are arranged inside the machine where the signals are to be utilized. The signals to be distributed are received by the receiver and transmitted to the next driving circuit which can be placed on the same integrated module. The signals at the output of the driving circuit can be utilized locally, and transmitted, through an electrical connection, such as, for instance, a coaxial cable, a twisted pair, to another device located at another place where the signal must be available. The number of the devices is a function of the bulk of the machine and the number of the points where the signal must be available.

According to this invention, the skew is cancelled by connecting the receiver and the driver together, in each of the devices, through a crossed connection, i.e., by connecting the true output of the receiver to the complementary input of the driver, and the complementary output of the receiver to the true input of the driver.

In order to improve the quality of the signals to be utilized locally, i.e., so that they are not influenced by the load of the transmission line, a plurality of driving circuits can be provided in the same device, one ensuring the transmission to a remote point, the other ones, ensuring the local distribution, for a local use. In that case, the driving circuits, then, are connected to the receiver outputs, through a crossed connection.

DETAILED DESCRIPTION OF THE INVENTION

Figure 1:
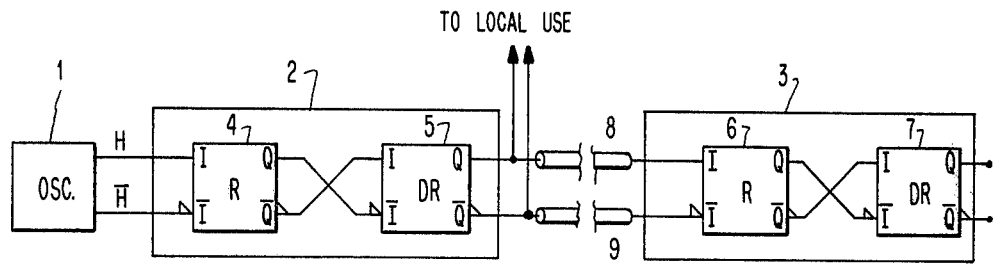
FIG. 1 is a schematic diagram of the principle of this invention.

FIG. 1 illustrates a signal transmission chain for transmitting signals which, in this preferred embodiment, are 180° phase-shifted clock signals H and $\overline{H}$. These signals can be supplied by any type of oscillator and associated circuit supplying phase-shift clock signals.

The transmission chain is comprised of a plurality of identical distribution devices two of which are shown on the drawing, by way of an example, and are designated by 2 and 3. The devices within the machine are connected to one another by means of a connection which, on the drawing, are coaxial cables.

Each device includes a receiving circuit R and driving circuit DR, namely receiver 4 and driver 5 for device 2 and receiver 6 and driver 7 for device 3. Each of the circuits R and DR include two complementary inputs I and $\overline{I}$ and two complementary output Q and $\overline{Q}$. All along this description, the inputs I and $\overline{I}$ or the outputs Q and $\overline{Q}$ of a particular circuit will have added thereto a suffix which is the reference number of this circuit; for instance, $I_4$ and $\overline{Q}_4$ will designate input I and output $\overline{Q}$ of circuit 4. The complementary input and output $\overline{I}$ and $\overline{Q}$ have also added thereto the distinctive sign .

The devices are connected to each other through cables 8 and 9 either directly or through identical devices.

Circuits R and DR are fully differential circuits, i.e., the signals on their inputs I and $\overline{I}$ are complementary as well as the signals on their outputs Q and $\overline{Q}$. It should be noted that, for each device, output Q is in phase with input I, and output $\overline{Q}$ is in phase with input $\overline{I}$. Examples of such circuits which can be utilized, will be given further on. Receiver R has for a function to receive the signals and to shape them and driver DR has for a function to transmit the signals to another remote device or to supply them for a local use.

Figure 2:
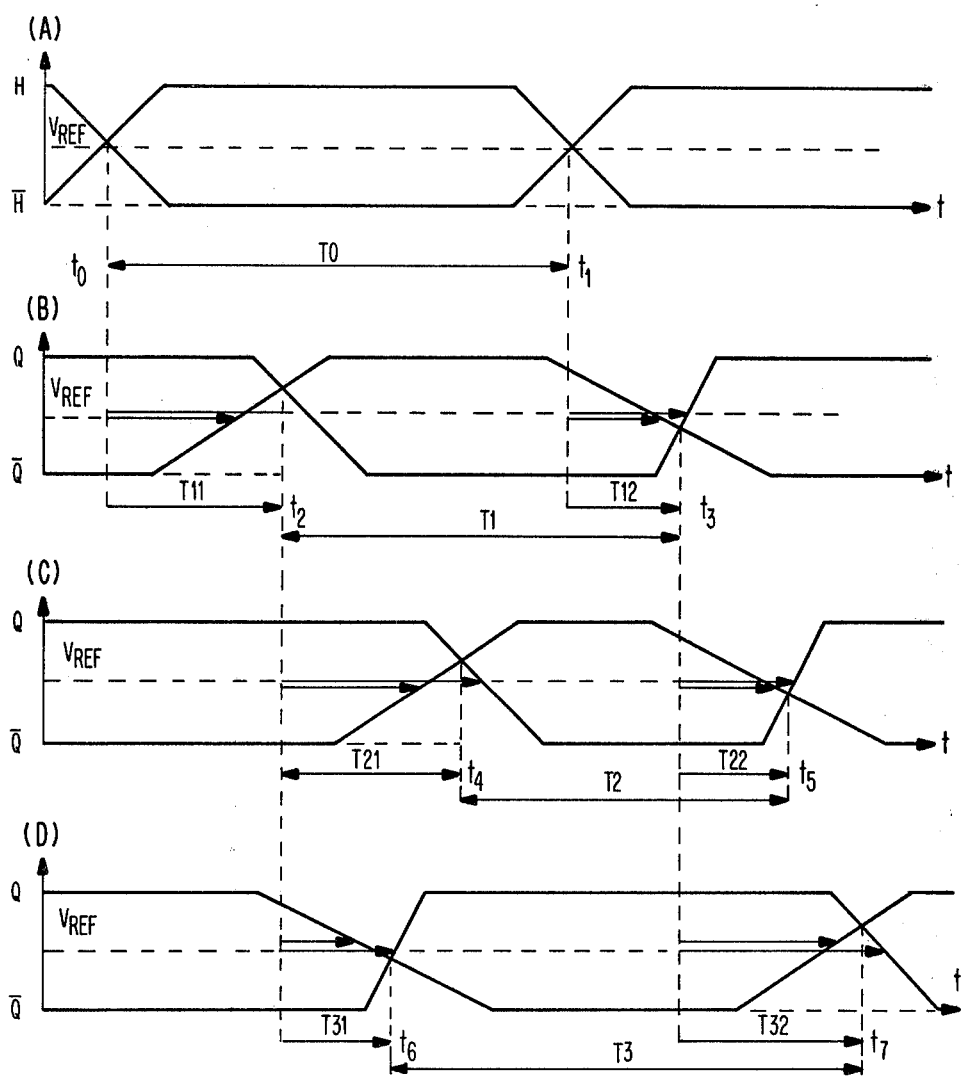
FIG. 2 is a time diagram illustrating the advantages of this invention.

As shown in FIG. 1, in a device, the true output Q of receiver R is connected to the input $\overline{I}$ of driver DR, thereby reducing the skews of the signal widths, as disclosed further on in reference to FIG. 2.

Figure 4:
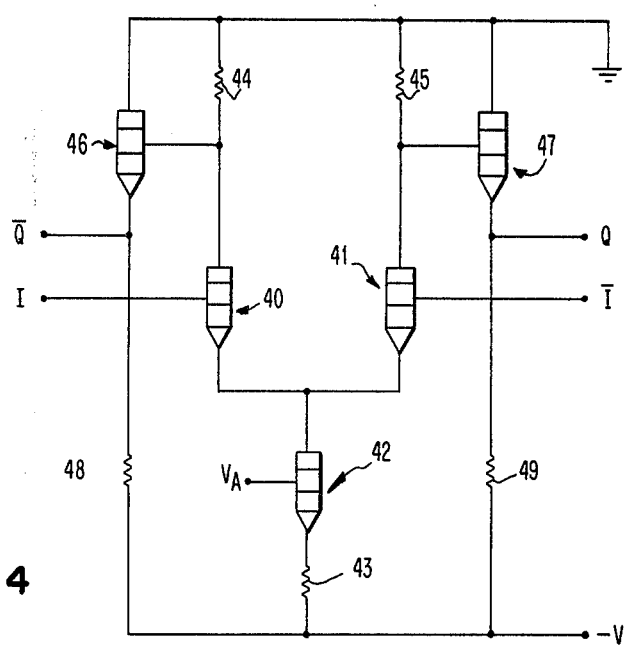
FIG. 4 is a schematic diagram of a receiver which can be utilized in the distribution systems of FIGS. 1 and 3.
Figure 5:
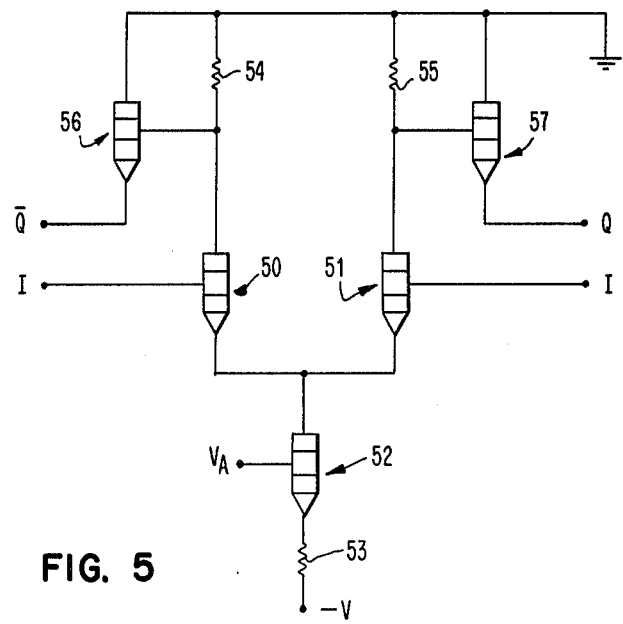
FIG. 5 is a schematic diagram of a driver which can be utilized in the distribution systems of FIGS. 1 and 3.

FIG. 2 illustrates the different waveforms which are obtained with receiving and driving circuits, for instance, of the emitter-coupled type, such as they will be disclosed further on in reference to FIGS. 4 and 5.

The complementary clock signals are illustrated, by way of an example, by waveforms A. They are the signals which are applied to the inputs I and $\overline{I}$ of the receiver R of the first device, for instance. The leading and trailing edges of these signals cross at times $t_0$ and $t_1$, the time interval To between these two time instants being equal to the pulse width which has to be preserved.

Waveform B illustrates, by way of an example, signals Q and $\overline{Q}$ at the receiver output and at the driver input. The receiving and driving circuits are, generally, transistor circuits operating in switching mode. The delays on the output signals are defined by the times when the output signals are crossing the reference voltage $V_{REF}$. The falling edge of $\overline{Q}$ crosses the reference voltage after a time length $T_B\overline{Q}$ with respect to $t_1$ and the rising edge of Q crosses the reference voltage after a time length $T_CQ$.

The falling edge of Q crosses the reference voltage after a time length $T_BQ$ with respect to $t_0$ and the rising edge of $\overline{Q}$ crosses the reference voltage after a time length $T_C\overline{Q}$. Likewise, the rising times $T_M$ and the falling times $T_D$ of the output signals Q and $\overline{Q}$ are, generally, not the same.

In the following description, the switching times will be assumed to be very much different from one another in order to illustrate on the time diagram the principles of this invention.

| | |
|---|---|
| $T_CQ$ = 4 time units | $T_C\overline{Q}$ = 5 time units |
| $T_BQ$ = 7 time units | $T_B\overline{Q}$ = 3 time units |
| $T_MQ$ = 2 time units | $T_M\overline{Q}$ = 6 time units |
| $T_DQ$ = 4 time units | $T_D\overline{Q}$ = 8 time units |

As shown in FIG. 2, the two signals Q and $\overline{Q}$ designated by B at the output of the receiver, have leading and trailing edges which cross at times $t_2$ and $t_3$, thereby defining pulse width $T_1$.

Since the receiving and driving circuits are chosen so as to be of the same type and technology, the above parameters are the same whether it is a receiver or a driver which is concerned.

Consequently, when the signals shown in B on FIG. 2, are applied to the driver through a direct connection, i.e., a connection which connects the output Q of the receiver to the input I of the driver, on the one hand, and the output $\overline{Q}$ of the receiver to the input $\overline{I}$ of the driver, on the other hand, there would be obtained on the output Q and $\overline{Q}$ of the driver, the signals shown in C the leading and trailing edges of which cross at $t_4$ and $t_5$, times which define pulse width T2.

On the other hand, when the receiver is connected to the driver through a crossed connection according to this invention, there are obtained at outputs Q and $\overline{Q}$ the signal illustrated in D the leading and trailing edges of which cross at $t_6$ and $t_7$, times which define pulse width T3.

As shown in FIG. 2, the time interval between $t_2$ and $t_0$ is T11, the time interval between $t_4$ and $t_2$ is T21=T11. The time interval between $t_3$ and $t_1$ is T12 and the time interval between $t_5$ and $t_3$ is T22=T12. Due to the crossed connection, the time interval between $t_6$ and $t_2$ is T31=T12 and the time interval between $t_7$ and $t_3$ is T32=T11.

Consequently:

$$T1 = T0 + T12 - T11$$

$$T3 = T1 + T32 - T31$$

which comes to T3=T0. With a skew in the pulse width equal to $$T3 - T0 = 0$$

As to the direct connection, one can write:

$$T2 = T1 - T21 + T22$$

since $$T1 = T1 + T12 - T11$$

there is obtained $$T2 - T0 = 2(T1 - T0).$$

Since T1−T0 is the skew of the pulse width because of the receiver, it can be observed that, contrary to the preceding case relative to the crossed connection where the skew was zero, the direct connection mode doubles up the initial skew T1−T0 of the pulse widths. With the parameters chosen by way of an example, there is obtained T1−T0=2.4 units and, consequently, the skew of the pulse width is equal to 4.8 units.

It is obvious that this result which has been shown geometrically in a simple manner, is obtained in any cases and can be verified mathematically.

In order to apply this principle, a small size integrated general purpose module is provided, which is comprised of one receiving circuit and several driving circuits. This module is arranged in the machine at the points where the clock signals have to be available.

Figure 3:
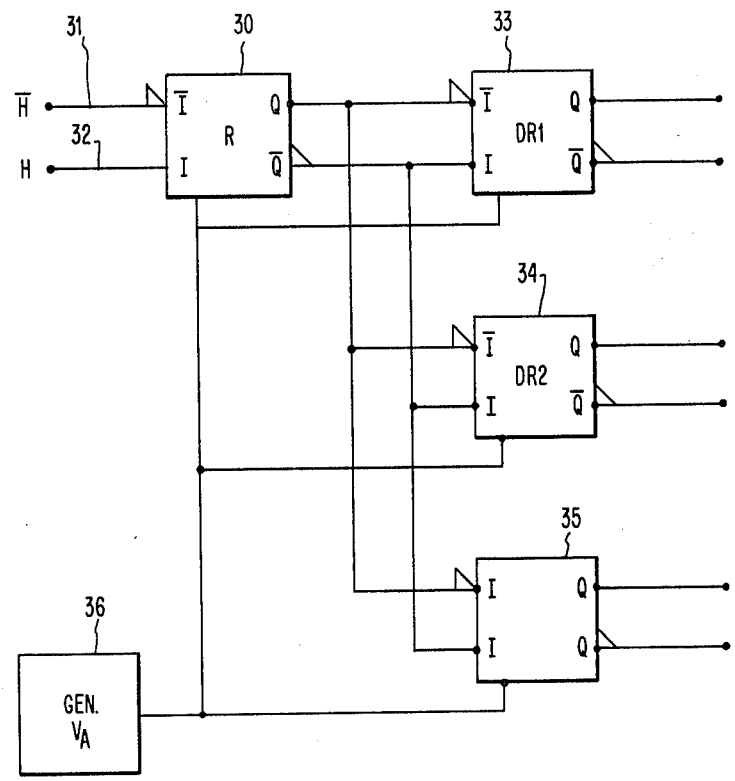
FIG. 3 is a schematic diagram of a universal module which can be utilized to feed a machine with digital signals.

The general configuration of the circuits on this module will be disclosed with reference to FIG. 3. It includes a receiver R, 30 which receives the signals to be transmitted and to be utilized locally, $\overline{H}$ and H, at its inputs 31 and 32. Three drivers DR1, DR2 and DR3 are provided, respectively, the inputs $\overline{I}$ of which are connected to the output Q of receiver 30, their inputs I being connected to output $\overline{Q}$. A voltage generator 36 supplies the operating voltage $V_A$ for the different circuits.

The signals on the outputs Q and $\overline{Q}$ of driver 33, can be transmitted to a remote point of the machine to the receiver of another identical module arranged at this very point. According to the location, the transmission can be carried out through coaxial cables or twisted pairs.

The signals at the outputs Q and $\overline{Q}$ of the drivers 34 and 35 are available for local use in circuits arranged on the same card as the module. Consequently, they are not influenced by the remote transmission, whereas they could be, in the case considered in FIG. 1.

Another advantage of this configuration is that the three driving circuits can, each, be identical, or else, they can have characteristics satisfying different requirements, such as impedance and level adaptation requirements. When, in the machine, the clock signals are to be conveyed over circuits of a different technology, it may be necessary to providethe clock signals with the adequate levels.

In addition, a more or less large number of driving circuits can be provided according to the impedance and the configuration of the machine.

FIG. 4 is a schematic diagram of a receiver adapted for use in the configurations of FIGS. 1 or 3.

The receiver is a coupled-emitter transistor receiver of the well-known type. It is comprised of two transistors 40 and 41 the bases of which are the inputs I and $\overline{I}$. The emitters are connected together to a current source formed of a transistor 42 the collector of which is connected to the common emitters, its emitter being connected to supply voltage $-V$, through resistor 43. The conducting state of transistor 42 is controlled by voltage $V_A$ which is applied to its base.

The collectors of transistors 40 and 41 are connected, through resistors 44 and 45, to another voltage supply which is equal to the ground in the preferred embodiment as well as to the bases of transistors 46 and 47 which are emitter-follower mounted. The emitters of transistors 46 and 47 are connected to voltage $-V$, through resistors 48 and 49, respectively, and their collectors are connected to the ground.

The outputs $\overline{Q}$ and Q of the receiver are tapped at the emitters of transistors 46 and 47, respectively.

The operation of such a circuit is very simple, and its principle will be briefly reminded. According to the levels on either of the inputs I and $\overline{I}$, either of transistors 40 or 41 is conducting, the other one being blocked. Consequently, the levels on the outputs $\overline{Q}$ and Q will be the reverse of those on the inputs I and $\overline{I}$, respectively.

According to this invention, the drivers have the same basic configuration in order to compensate for the skews in the pulse width, through the crossed connections of this invention.

An example of the driver which can be utilized for the implementation of this invention, is shown in FIG. 5. As shown in FIG. 5, the driver configuration is identical with that shown in FIG. 4 except that the emitter resistors of the emitter-follower transistors have been omitted. It is comprised of two coupled-emitter transistors 50 and 51 associated with a current supply including transistor 52 and resistor 53. The bases of transistors 50 and 51 are the inputs I and $\overline{I}$ and, therefore, they will be connected to the outputs $\overline{Q}$ and Q the receiver, respectively. The collectors of the transistors 50 and 51 are connected to ground, through two resistors 54 and 55 and are also connected to the bases of the emitter-follower lower transistors 56 and 57 respectively. The collectors of transistors 56 and 57 are connected to ground and the outputs Q and $\overline{Q}$ of the driver are taken from the emitters of transistors 57 and 56, respectively.

Since the outputs are kept floating in the module, the power dissipation is reduced when the driver is not utilized. In addition, any type of load can be applied at the outputs.

This module is suitable for a very flexible distribution of the clock signals or any other type, within a machine. Indeed, the different portions of the machine can be star-supplied from a central point or else, they can be series-supplied. These two types of supply can be combined. It suffices to arrange the modules according to the configuration of the machine, at the most appropriate points.

The way the connections are made between the distribution modules does not matter, they can be either direct or crossed; what matters is that the modules themselves be achieved the way shown in FIG. 3.

While the invention has been particularly shown and described with reference to a preferred embodiment thereof, it will be understood by those skilled in the art that numerous changes in form and detail may be made therein without departing from the spirit and scope of the invention.

What is claimed is:

1. A digital signal distribution system for distributing digital signals to points of a signal transmission chain, characterized in that it includes, at each of said points:
   a distribution device being comprised of a receiver and at least one driver, said receiver and driver which are matched and have a true input and a complementary input respectively in phase with a true output and a complementary output, are connected such that the true output of the receiver is connected to the complementary input of the driver and the complementary output of the receiver is connected to the true input of the driver.

2. A distribution system according to claim 1, characterized in that the receiver is connected to receive the digital signals to be distributed, on its true and complementary inputs, and the driver is connected thereto to supply, on the true and complementary outputs thereof, the signals to that portion of said signal transmission chain which is arranged at this point, said driver also being connected to another receiver of another distribution device arranged at another point, the true and complementary outputs of said driver being connected, respectively, to the true and complementary inputs of said another receiver.

3. A distribution system according to claim 1, characterized in that each distribution device includes several drivers, one of said drivers supplying on the true and complementary outputs thereof, the digital signals to the receiver of a device arranged at a remote point, and the other drivers supplying on the true and complementary outputs thereof, the signals for a local use.

4. A system according to claim 1, characterized in that the receiver and the drivers are logic circuits of the emitter-coupled transistors type.

* * * * *